United States Patent
Ouyang et al.

(10) Patent No.: US 10,976,385 B2
(45) Date of Patent: Apr. 13, 2021

(54) ALL-QUADRANT MEASUREMENT METHOD FOR MIDDLE-LARGE MAGNETIC FIELD

(71) Applicants: TSINGHUA UNIVERSITY, Beijing (CN); SICHUAN ENERGY INTERNET RESEARCH INSTITUTE, TSINGHUA UNIVERSITY, Sichuan (CN)

(72) Inventors: Yong Ouyang, Sichuan (CN); Jinliang He, Beijing (CN); Jun Hu, Beijing (CN); Shanxiang Wang, Beijing (CN); Gen Zhao, Beijing (CN); Zhongxu Wang, Beijing (CN); Rong Zeng, Beijing (CN); Chijie Zhuang, Beijing (CN); Bo Zhang, Beijing (CN); Zhanqing Yu, Beijing (CN)

(73) Assignees: TSINGHUA UNIVERSITY, Beijing (CN); SICHUAN ENERGY INTERNET RESEARCH INSTITUTE, TSINGHUA UNIVERSITY, Sichuan (CN)

(*) Notice: Subject to any disclaimer, the term of this patent is extended or adjusted under 35 U.S.C. 154(b) by 194 days.

(21) Appl. No.: 16/462,381

(22) PCT Filed: Jun. 28, 2017

(86) PCT No.: PCT/CN2017/090545
§ 371 (c)(1),
(2) Date: May 20, 2019

(87) PCT Pub. No.: WO2018/090634
PCT Pub. Date: May 24, 2018

(65) Prior Publication Data
US 2019/0369173 A1  Dec. 5, 2019

(30) Foreign Application Priority Data

Nov. 18, 2016 (CN) .......................... 201611019183.7

(51) Int. Cl.
*G01R 33/09* (2006.01)

(52) U.S. Cl.
CPC ......... *G01R 33/093* (2013.01); *G01R 33/098* (2013.01)

(58) Field of Classification Search
CPC ............................ G01R 33/093; G01R 33/098
See application file for complete search history.

(56) References Cited

U.S. PATENT DOCUMENTS

2012/0053059 A1   3/2012  Hatsukade et al.
2019/0339342 A1*  11/2019  He ...................... G01R 33/098

FOREIGN PATENT DOCUMENTS

CN      102129053 A     7/2011
CN      102707246 A     10/2012
(Continued)

*Primary Examiner* — Minh Q Phan
(74) *Attorney, Agent, or Firm* — Novick, Kim & Lee, PLLC; Allen Xue

(57) ABSTRACT

An all-quadrant measurement method for a middle-large magnetic field includes the steps of placing four orthogonally configured magnetic resistances in an external magnetic field; determining two magnetic resistances with the minimum resistance values, thereby determining that the other two magnetic resistances are in an S1 status, and making resistance values of the two magnetic resistances which are in the S1 status be R1 and R2, and at the same time taking an initial reference layer magnetization direction of the two magnetic resistances as a given reference layer magnetization direction when there is no magnetic field; respectively calculating an included angle between a free layer magnetization direction and the reference layer magnetization direction of the two magnetic resistances; respec- (Continued)

tively calculating the free layer magnetization direction of the two magnetic resistances; and solving a magnetic field amplitude and direction of the external magnetic field.

5 Claims, 5 Drawing Sheets

(56) References Cited

FOREIGN PATENT DOCUMENTS

| | | |
|---|---|---|
| CN | 102830374 A | 12/2012 |
| CN | 106772147 A | 5/2017 |
| JP | 2007534340 A | 11/2007 |

\* cited by examiner

| Direction of measured magnetic field | Chip of two smallest resistances | Chips of two resistances in the S1 status |
|---|---|---|
| 0°~90° | $R_2$, $R_3$ | $R_1$, $R_2$ |
| 90°~180° | $R_3$, $R_4$ | $R_2$, $R_3$ |
| 180°~270° | $R_4$, $R_1$ | $R_3$, $R_4$ |
| 270°~360° | $R_1$, $R_2$ | $R_4$, $R_1$ |

Fig. 7

ALL-QUADRANT MEASUREMENT METHOD FOR MIDDLE-LARGE MAGNETIC FIELD

FIELD

The present invention relates to the technical field of magnetic field measurement, and more particularly relates to a measurement method for the intensity of a middle-large magnetic field.

BACKGROUND

A tunneling magnetic resistance has a good linearity and relatively high measurement accuracy when a magnetic field to be measured is relatively small, but it can hardly measure a middle-large magnetic field (the intensity of which is about 4~6 $H_{AF}$. $H_{AF}$ is an anisotropy field of a free layer of the magnetic resistance, and different magnetic resistances have different $H_{AF}$ which is generally dozens Oe. Oe is the unit of the intensity of the magnetic field—Oersted). The reasons are as below: 1) as a sensing curve of the tunneling magnetic resistance tends from linearity to saturation in the middle-large magnetic field, showing severe nonlinearity, it is necessary to build a nonlinear model for calculation; 2) a reference layer of the tunneling magnetic resistance would rotate significantly, so its influence must be taken into consideration; and 3) a magnetic domain direction of the tunneling magnetic resistance may possibly rotate irreversibly, which will lead to resistance value jumping and form two different bifurcate sensing curves.

SUMMARY

In order to solve the technical problem, the present invention provides a vector measurement method applicable to a magnetic resistance of a middle-large magnetic field.

A measurement method for a middle-large magnetic field provided by the present invention includes:

step 1: placing four orthogonally configured magnetic resistances in an external magnetic field, wherein the first magnetic resistance and the third magnetic resistance are located on one straight line, and the second magnetic resistance and the fourth magnetic resistance are located on the other straight line; the one straight line is perpendicular to the other straight line, and internal easy-axis bias magnetic fields of free layers of the four magnetic resistances are greater than an anisotropy field;

step 2: determining two magnetic resistances with the minimum resistance values, thereby determining that the other two magnetic resistances are in an S1 status, and making resistance values of the two magnetic resistances which are in the S1 status be $R_1$ and $R_2$, and at the same time taking initial reference layer magnetization directions of the two magnetic resistances which are in the S1 status as given reference layer magnetization directions $\varphi_{R1}$ and $\varphi_{R2}$ when there is no magnetic field, wherein the S1 status means that a magnetic domain of a free layer of a magnetic resistance is in an easy-axis positive direction;

step 3: respectively calculating, according to the resistance values $R_1$ and $R_2$, included angles between free layer magnetization directions and the reference layer magnetization directions of the two magnetic resistances which are in the S1 status;

step 4: respectively calculating, according to the given reference layer magnetization directions $\varphi_{R1}$ and $\varphi_{R2}$ of the two magnetic resistances which are in the S1 status and the included angles between the free layer magnetization directions and the reference layer magnetization directions of the two magnetic resistances which are in the S1 status, the free layer magnetization directions of the two magnetic resistances which are in the S1 status;

step 5: solving, according to the given reference layer magnetization directions and the free layer magnetization directions of the two magnetic resistances which are in the S1 status, a magnetic field amplitude and direction of the external magnetic field; and step 6: comparing the magnetic field amplitude and direction, calculated at this time, of the external magnetic field with a previous calculation result, updating, according to the magnetic field amplitude and direction, calculated at this time, of the external magnetic field, the reference layer magnetization directions of the two magnetic resistances which are in the S1 status if a difference between the two results is greater than a set threshold value and taking the directions as new given reference layer magnetization directions $\varphi_{R1}$ and $\varphi_{R2}$, and carrying out steps 2 to 6 till the difference between the two results is smaller than the set threshold value.

Further, in step 3, formulas for calculating the included angles between the free layer magnetization directions and the reference layer magnetization directions of the two magnetic resistances which are in the S1 status are respectively as below:

$$|\varphi_{F1} - \varphi_{R1}| = \arccos\left(\frac{R_{1max} + R_{1min} - 2R_1}{R_{1max} - R_{1min}}\right)$$

wherein $\varphi_{F1}$ is the free layer magnetization direction of the first magnetic resistance in the S1 status, $R_{1min}$ is the minimum value of the first magnetic resistance in the S1 status, and $R_{1max}$ is the maximum value of the first magnetic resistance in the S1 status;

$$|\varphi_{F2} - \varphi_{R2}| = \arccos\left(\frac{R_{2max} + R_{2min} - 2R_2}{R_{2max} - R_{2min}}\right)$$

wherein $\varphi_{F2}$ is the free layer magnetization direction of the second magnetic resistance in the S1 status, $R_{2min}$ is the minimum value of the second magnetic resistance in the S1 status, and $R_{2max}$ is the maximum value of the second magnetic resistance in the S1 status.

Further, in step 4 of calculating the free layer magnetization directions of the two magnetic resistances which are in the S1 status according to the formula, $\varphi_F = \varphi_{R^+} |\varphi_F - \varphi_R|$, $|\varphi_{F1} - \varphi_{R1}|$ and $\varphi_{R1}$ are substituted into the previous formula to obtain the free layer magnetization direction $\varphi_{F1}$ of the first magnetic resistance in the S1 status, and $|\varphi_{F2} - \varphi_{R2}|$ and $\varphi_{R2}$ are substituted into the previous formula to obtain the free layer magnetization direction $\varphi_{F2}$ of the second magnetic resistance in the S1 status, wherein $\varphi_F$ is the free layer magnetization direction of the magnetic resistance in the S1 status, $\varphi_R$ is the reference layer magnetization direction of the magnetic resistance in the S1 status, and $|\varphi_F - \varphi_R|$ is the included angle between the free layer magnetization direction and the reference layer magnetization direction of the magnetic resistance in the S1 status.

Further, step 5 includes solving the magnetic field amplitude $h_F$ and direction $\theta$ of the external magnetic field by using the following equation set:

$$\begin{pmatrix} -\sin(\alpha_1+\varphi_{F1}) & \cos(\alpha_1+\varphi_{F1}) \\ -\sin(\alpha_2+\varphi_{F2}) & \cos(\alpha_2+\varphi_{F2}) \end{pmatrix}\begin{pmatrix} h_F\cos\theta \\ h_F\sin\theta \end{pmatrix} =$$

$$\begin{pmatrix} h_{BF}\sin(\varphi_{F1}-\theta_{BF})+\sin\varphi_{F1}\cos\varphi_{F1}-h_{JFR}\sin(\varphi_{F1}-\varphi_{R1}) \\ h_{BF}\sin(\varphi_{F2}-\theta_{BF})+\sin\varphi_{F2}\cos\varphi_{F2}-h_{JFR}\sin(\varphi_{F2}-\varphi_{R2}) \end{pmatrix}$$

wherein $\alpha_1$ and $\alpha_2$ are respectively easy-axis directions of the two magnetic resistances which are in the S1 status; $h_{JFR}$ is a coupling field of the free layer and the reference layer of any one of the magnetic resistances, $h_{BF}=H_{BF}/H_{AF}$; $H_{BF}$ refers to the size of an internal bias magnetic field of a free layer of a magnetic resistance; $H_{AF}$ refers to the size of an anisotropy field of a free layer; and $\theta_{BF}$ is the direction of the internal bias magnetic field of the free layer.

Further, step 6 of updating the reference layer magnetization directions $\varphi_{R1}$ and $\varphi_{R2}$ of the two magnetic resistances which are in the S1 status further includes:

solving a quartic equation $x_1^4-2h_{X1}x_1^3+(h_{X1}^2+h_{Y1}^2-1)x_1^2+2h_{X3}x_1-h_{X1}^2=0$, wherein $h_{X1}$ and $h_{Y1}$ are respectively magnetic fields, in an easy-axis direction and a hard-axis direction of the first magnetic resistance in the S1 status, of the external magnetic field, and are obtained according to the calculation result of step 5: $h_{x1}=h_{F\cos\theta}$, $h_{y1}=h_F\sin\theta$; $x_1=\sin\varphi_{R1}$;

the abovementioned quartic equation has four solutions; when the magnetic resistance is in a stable balanced state, $\varphi_{R1}$ only has one solution which is decided by three conditions that:

1) $x_1$ is a real number, and $|x_1|<=1$;
2) $h_{Y1\cos\varphi_{R1}}+h_{X1\sin\varphi_{R1}}+\cos 2\varphi_{R1}>=0$; and
3) the energy of all angles between the solution and an initial position of the magnetic resistance must be smaller than the energy of the initial position;

solving a quartic equation $x_2^4-2h_{X2}x_2^3+(h_{X2}^2+h_{Y2}^2-1)x_2^2+2h_{X2}x_2-h_{X2}^2=0$, wherein $h_{X2}$ and $h_{Y2}$ are respectively magnetic fields, in an easy-axis direction and a hard-axis direction of the second magnetic resistance in the S1 status, of the external magnetic field, and are obtained according to the calculation result of step 5: $h_{x2}=h_F\sin\theta$, $h_{y2}=h_F\cos\theta$; $x_2=\sin\varphi_{R2}$;

the abovementioned quartic equation has four solutions; when the magnetic resistance is in a stable balanced state, $\varphi_{R2}$ only has one solution which is decided by three conditions that:

1) $x_2$ is a real number, and $|x_2|<=1$;
2) $h_{Y2\cos\varphi_{R2}}+h_{X2\sin\varphi_{R2}}+\cos 2\varphi_{R2}>=0$; and
3) the energy of all angles between the solution and an initial position of the magnetic resistance must be smaller than the energy of the initial position; and the solved $\varphi$ values are respectively taken as new given reference layer magnetization directions $\varphi_{R1}$ and $\varphi_{R2}$.

According to the above, by the adoption of the technical solution, the present invention has the beneficial effects that:

the measurement method for a middle-large magnetic field provided by the present invention realizes accurate measurement of the middle-large magnetic field and expands the magnetic field intensity measurement range of the magnetic resistance.

BRIEF DESCRIPTION OF THE DRAWINGS

The present invention will be described via examples with reference to accompanying drawings. In the drawings:

FIG. 7 shows statuses of four magnetic resistances in different directions of the measured magnetic field when the four magnetic resistances are disposed as shown in FIG. 4.

DETAILED DESCRIPTION OF THE EMBODIMENTS

All features or steps in all methods or processes disclosed in this description can be combined in any form except mutually exclusive features and/or steps.

Unless otherwise particularly described, any feature disclosed in this description can be replaced by other equivalent replacement features or replacement features with similar purposes. That is, unless otherwise particularly described, each feature is only one example in a series of equivalent or similar features.

The method of the present invention is applicable to magnetic resistances such as a tunneling magnetic resistance and a giant reluctance resistance. The present embodiment is described by taking the tunneling magnetic resistance for example.

Figure 1:
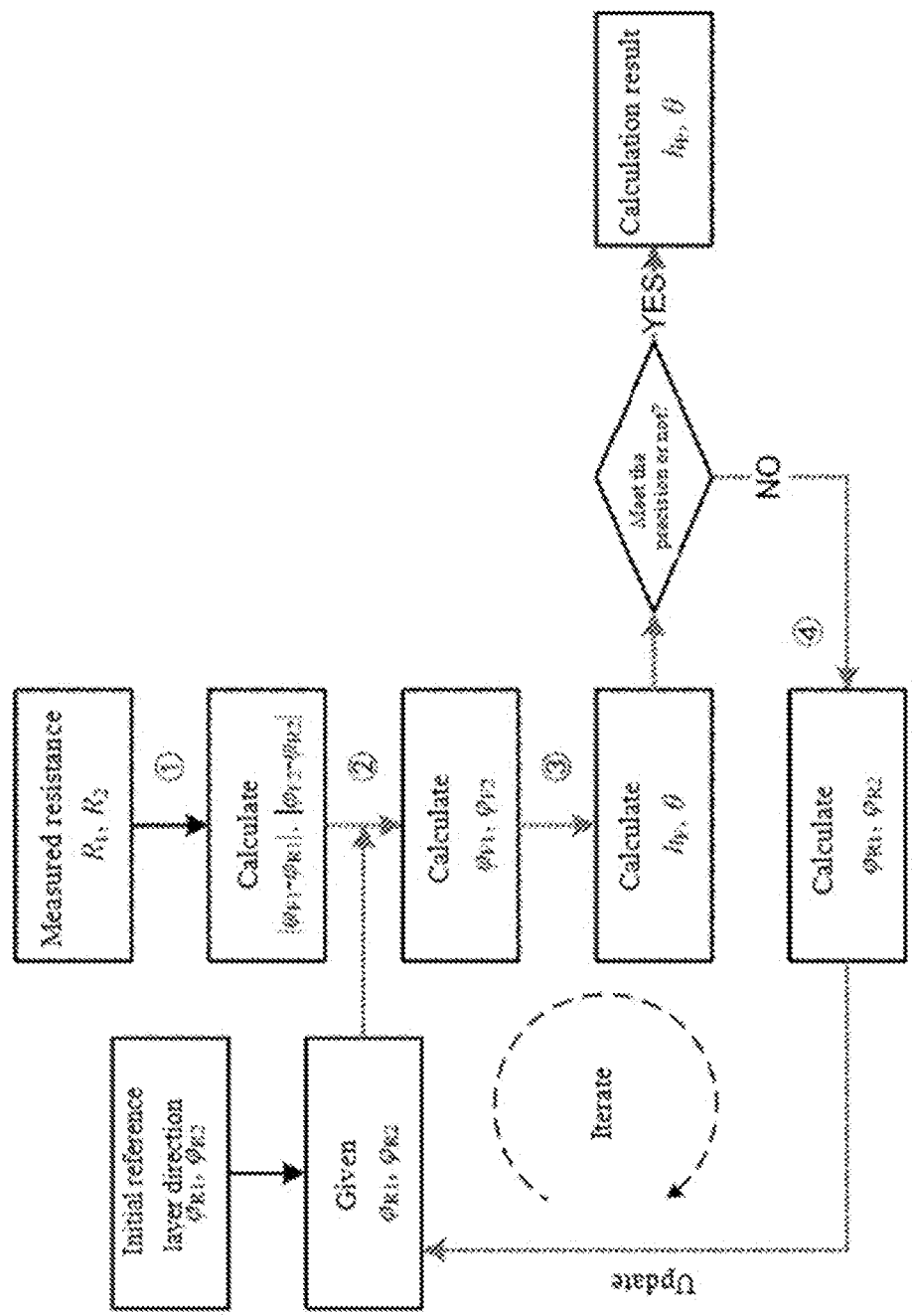
FIG. 1 is a flowchart of a method of the present invention.

As shown in FIG. 1, one embodiment of the method of the present invention includes the following steps that:

(1) for any external magnetic field, two tunneling magnetic resistances $R_1$ and $R_2$ in different easy-axis directions are measured, and initial reference layer magnetization directions are taken as given directions $\varphi_{R1}$ and $\varphi_{R2}$ when there is no magnetic field. It should be noted that a typical core structure of each of the tunneling magnetic resistances includes an antiferromagnetic layer (pinning layer)/ferromagnetic layer (pinned layer)/non-magnetic metal/ferromagnetic layer (reference layer)/potential barrier layer/ferromagnetic layer (free layer), and a current is perpendicular to a film surface. The reference layer and the pinned layer are induced via a layer of extremely thin non-magnetic metal to form an artificially synthesized antiferromagnetic structure, so that the magnetization directions of the reference layer and the pinned layer are more stable and are not prone to destroy in an external strong magnetic field, and the magnetization direction of the free layer varies with the external magnetic field;

if a tunneling magnetic resistance is easiest to magnetize along a certain axis or direction, it is called easy axis, otherwise, it is called hard axis;

the resistance value of a tunneling magnetic resistance may vary with a change of an external magnetic field, so that the external magnetic field is measured by measuring the resistance value of the tunneling magnetic resistance. Two tunneling magnetic resistances having different easy-axis directions are placed in the external magnetic field, and their resistance values may be obtained through a full bridge or other resistance measurement circuits;

(2) included angles $|\varphi_{F1}-\varphi_{R1}|$ and $|\varphi_{F2}-\varphi_{R2}|$ between free layer magnetization directions and reference layer magnetization directions of the resistances are calculated according to the resistance values of the two resistances; corresponding to the process (1) as shown in FIG. 1, the calculation formulas are as follows:

$$|\varphi_{F1} - \varphi_{R1}| = \arccos\left(\frac{R_{1max} + R_{1min} - 2R_1}{R_{1max} - R_{1min}}\right)$$

wherein $\varphi_{F1}$ is the free layer magnetization direction of the first tunneling magnetic resistance, $R_{1min}$ is the minimum value of the first tunneling magnetic resistance, and $R_{1max}$ is the maximum value of the first tunneling magnetic resistance; and $$|\varphi_{F2} - \varphi_{R2}| = \arccos\left(\frac{R_{2max} + R_{2min} - 2R_2}{R_{2max} - R_{2min}}\right)$$

wherein $\varphi_{F2}$ is the free layer magnetization direction of the second tunneling magnetic resistance, $R_{2min}$ is the minimum value of the second tunneling magnetic resistance, and $R_{2max}$ is the maximum value of the second tunneling magnetic resistance;

$R_{1min}$, $R_{1max}$, $R_{2min}$ and $R_{2max}$ may be obtained by respectively calibrating the two tunneling magnetic resistances;

(3) the free layer magnetization directions $\varphi_{F1}$ and $\varphi_{F2}$ are calculated according to the given reference layer magnetization directions; corresponding to the process (2) as shown in FIG. 1, the calculation formulas are as follows:

$$\varphi_F = \begin{cases} \varphi_R + |\varphi_F - \varphi_R|, S_1 \\ \varphi_R - |\varphi_F - \varphi_R|, S_2 \end{cases};$$

Figure 2:
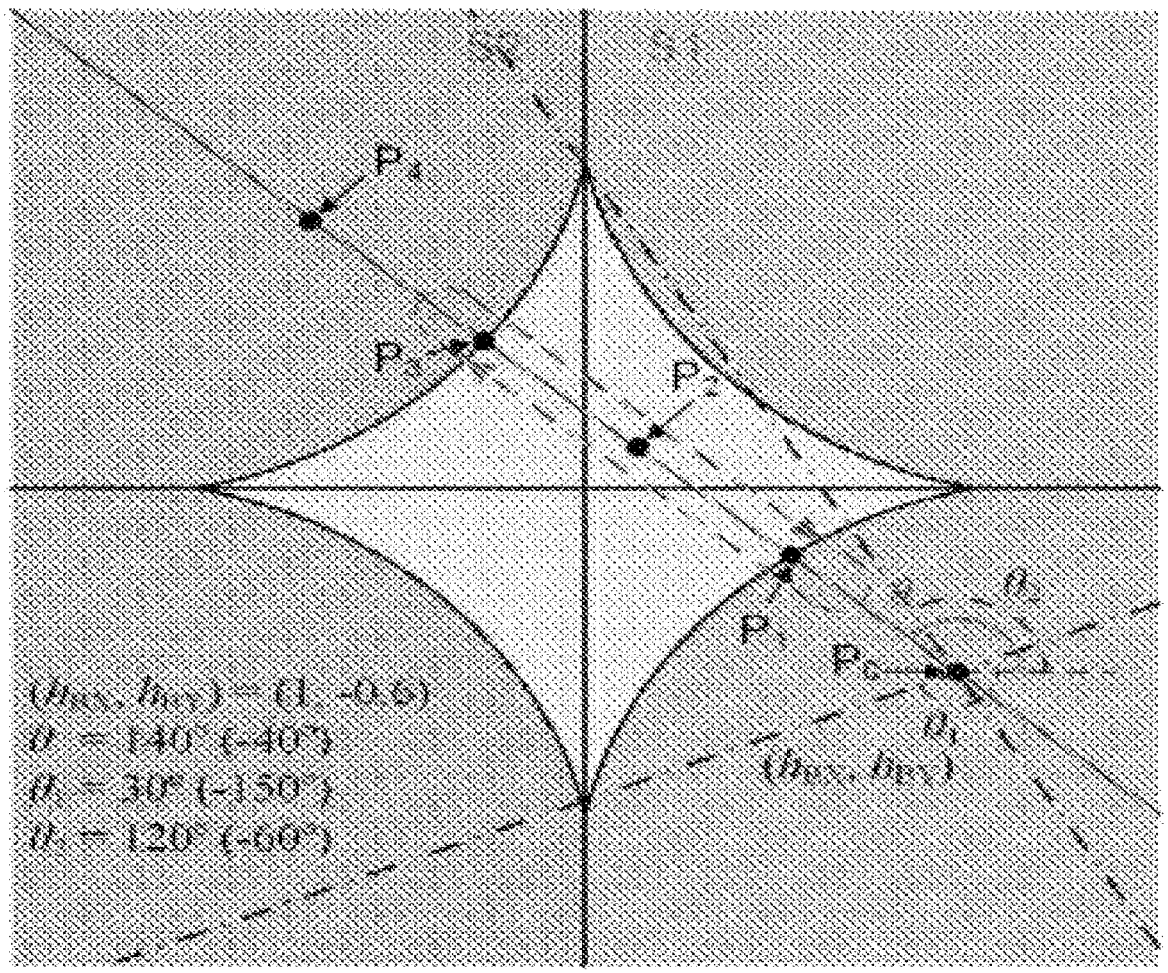
FIG. 2 is a normalized asteroid-shaped curve diagram of a single-domain behavior of a tunneling magnetic resistance.

$|\varphi_{F1}-\varphi_{R1}|$ and $\varphi_{R1}$ are substituted into the previous formula to obtain the free layer magnetization direction $\varphi_{F1}$ of the first tunneling magnetic resistance, and $\varphi_{F2}-\varphi_{R2}|$ and $\varphi_{R2}$ are substituted into the previous formula to obtain the free layer magnetization direction $\varphi_{F2}$ of the second tunneling magnetic resistance;

in the formula, $S_1$ and $S_2$ respectively represent that the magnetic domains of the free layers are in an easy-axis positive direction range ($-\pi/2$ to $\pi/2$) or easy-axis negative direction range ($\pi/2$ to $3\pi/2$) as shown in FIG. 2; for a specific magnetic resistance, the status of the magnetic domain of its free layer is unique;

(4) a magnetic field amplitude $h_F$ and direction $\theta$ of the measured magnetic field are calculated according to the calculated free layer magnetization directions $\varphi_{F1}$ and $\varphi_{F2}$; corresponding to the process (3) as shown in FIG. 1, the calculation formula is as follows:

$$\begin{pmatrix} -\sin(\alpha_1 + \varphi_{F1}) & \cos(\alpha_1 + \varphi_{F1}) \\ -\sin(\alpha_2 + \varphi_{F2}) & \cos(\alpha_2 + \varphi_{F2}) \end{pmatrix} \begin{pmatrix} h_F\cos\theta \\ h_F\sin\theta \end{pmatrix} =$$
$$\begin{pmatrix} h_{BF}\sin(\varphi_{F1} - \theta_{BF}) + \sin\varphi_{F1}\cos\varphi_{F1} - h_J\sin(\varphi_{F1} - \varphi_{R1}) \\ h_{BF}\sin(\varphi_{F2} - \theta_{BF}) + \sin\varphi_{F2}\cos\varphi_{F2} - h_J\sin(\varphi_{F2} - \varphi_{R2}) \end{pmatrix};$$

in the formula, $\alpha_1$ and $\alpha_2$ are respectively easy-axis directions of the two tunneling magnetic resistances; $h_{JFR}$ is a coupling field of the free layer and the reference layer of any one of the tunneling magnetic resistances, $h_{BF}=H_{BF}/H_{AF}$; $H_{BF}$ refers to the size of an internal bias magnetic field of a free layer of a tunneling magnetic resistance; $H_{AF}$ refers to the size of an anisotropy field of a free layer; and $\theta_{BF}$ is the direction of the internal bias magnetic field of the free layer; when the various tunneling magnetic resistances are the same, it is considered that their internal intrinsic parameters are the same; and (5) the calculated magnetic field parameters are compared with a previous calculation result to judge whether the parameters meet an accuracy requirement (in the present embodiment, when a difference of the magnetic field intensity in the two calculation results is smaller than 1E-4 and a difference of the direction is smaller than 0.01 degree, it is considered that the parameters meet the accuracy requirement), and results are output if the requirement is met, otherwise, the reference layer magnetization direction angles $\varphi_{R1}$ and $\varphi_{R2}$ are calculated and updated according to the magnetic field, as shown in the process (4) in the figure, and step (2) is returned to continuously carry out iteration.

Updating the reference layer magnetization direction angles includes that:

a quartic equation $x_1^4 - 2h_{X1}x_1^3 + (h_{X1}^2 + h_{Y1}^2 - 1)x_1^2 + 2h_{X3}x_1 - h_{X1}^2 = 0$ is solved, wherein $h_{X1}$ and $h_{Y1}$ are respectively magnetic fields, in an easy-axis direction and a hard-axis direction of the first magnetic resistance, of the external magnetic field, and are obtained according to the calculation result of step 4: $h_{X1}=h_F\cos\theta$, $h_{Y1}=h_F\sin\theta$; $x_1=\sin\varphi_{R1}$.

The abovementioned quartic equation has four solutions. When the tunneling magnetic resistance is in a stable balanced state, $\varphi_{R1}$ only has one solution which is decided by three conditions that:

1) $x_1$ is a real number, and $|x_1|<=1$;
2) $h_{Y1}\cos\varphi_{R1}+h_{X1}\sin\varphi_{R1}+\cos 2\varphi_{R1}>=0$; and
3) the energy of all angles between the solution and an initial position of the tunneling magnetic resistance must be smaller than the energy of the initial position.

A quartic equation $x_1^4 - 2h_{X2}x_2^3 + (h_{X2}^2 + h_{Y2}^2 - 1)x_2^2 + 2h_{X2}x_2 - h_{X2}^2 = 0$ is solved, wherein $h_{X2}$ and $h_{Y2}$ are respectively magnetic fields, in an easy-axis direction and a hard-axis direction of the second magnetic resistance, of the external magnetic field, and are obtained according to the calculation result of step 4: $h_{X2}=h_F\sin\theta$, $h_{Y2}=h_F\cos\theta$ and $x_2=\sin\varphi_{R2}$ as the first magnetic resistance and the second magnetic resistance are orthometric.

$\varphi_{R2}$ is determined similarly to the screening process of $\varphi_{R1}$.

The solved $\varphi$ values are respectively taken as new given reference layer magnetization directions $\varphi_{R1}$ and $\varphi_{R2}$.

In other embodiments, the following formula is solved by virtue of a computer value method to obtain the reference layer magnetization direction angles of the magnetic resistances. That is, technicians substitutes possible angles into the following formula for calculation to judge whether the result is close to 0 or not; and if yes, it is considered that the substituted angle is a solution for $\varphi$: $h_Y\sin\varphi - h_X\cos\varphi + \sin\varphi\cos\varphi = 0$, and $h_X$ and $h_Y$ are respectively magnetic fields, in the easy-axis direction and the hard-axis direction of the magnetic resistance, of the external magnetic field. The above formula is a general expression for calculating the magnetization direction angle of the reference layer through a tunneling magnetic resistance single-domain model. If x is set to be equal to $\sin\varphi$, the formula can be evolved as:

$x^4-2h_Xx^3+(h_X^2+h_Y^2-1)x^2+2h_Xx_1-h_X^2=0$ which is the formula for calculating the reference layer magnetization direction in the previous embodiment. However, the computer value method used for solving has problems on the accuracy, the time and the global convergence, so that the previous embodiment is recommended to calculate the reference layer magnetization direction of the magnetic resistance.

Due to the abovementioned iteration, the reference layer magnetization direction is gradually converged to a real direction, and the calculated external magnetic field is also converged to a real external magnetic field. The convergence of the iteration algorithm depends on the convergence during calculation of the reference layer magnetization direction.

If the iteration is carried out repeatedly for a set number of times, the difference between the calculation result and the prevision calculation result is still not smaller than the set value, it is considered that no convergence occurs in the calculation process, and the current external magnetic field is an extremely large magnetic field. The set number of times is set according to different magnetic resistances and calculation accuracy requirements. The set number of times in the present embodiment is 20.

Figure 3:
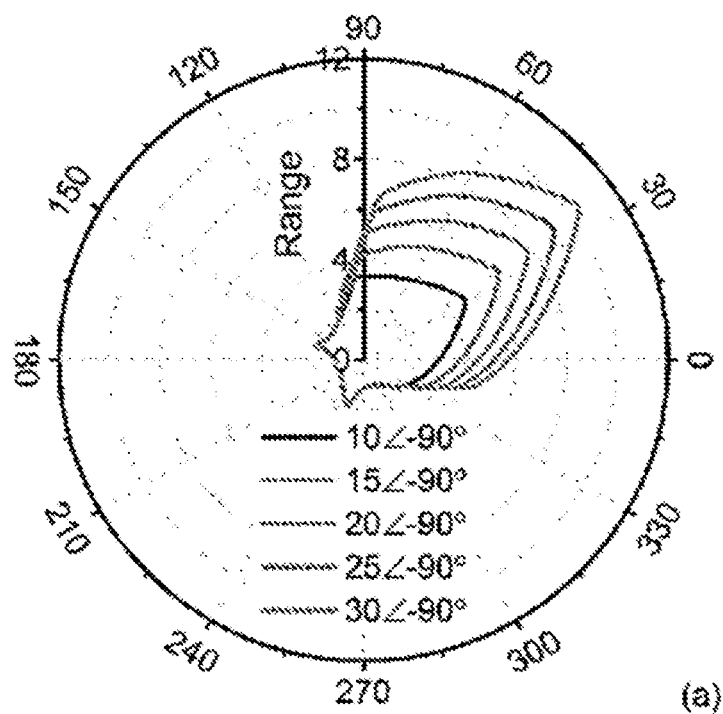
FIG. 3 is a simulated diagram of a measurement range varying with the intensity and angle of a measured magnetic field during measurement of the magnetic field with two magnetic resistances.

FIG. 3 is a simulation of a measurement range of a magnetic field direction varying with different angles of a measured magnetic field during measurement of the magnetic field in the present embodiment. It can be seen that when the measured magnetic field is in 0 to 90 degrees, the free layers of the two magnetic resistances are always in an S1 status, and the magnetic domain may not irreversibly rotate, so that the formula used in step (3) in the iteration algorithm is determined as the value in the S1 status to achieve a relatively large measurement range. When the measured magnetic field is in 90 to 360 degrees, the magnetic domain may possibly irreversibly rotate; and at the moment, the status of the free layer of the magnetic resistance is not determined, and the status of the free layer of a chip cannot be determined in advance. If the formula used in step (3) in the iteration algorithm is fixed to a value in the S1 status, when the magnetic field is small, the free layer of the chip is still in the S1 status, and the iteration algorithm is effective; and when the magnetic field is large, the iteration algorithm is finally converged to a wrong value or is not converged due to the irreversible rotation of the magnetic domain. Therefore, in case of only two chips, the measurement range depends on a distance from the internal bias field of the free layer to the asteroid-shaped curve when the measured magnetic field is 90 to 360 degrees, and at the moment, the magnetic domain rotates reversibly and continuously. Generally, the internal bias field of the free layer is extremely small and the distance from it to the asteroid-shaped curve is extremely short, so that the measurement range in 90 to 360 degrees is very small.

Figure 4:
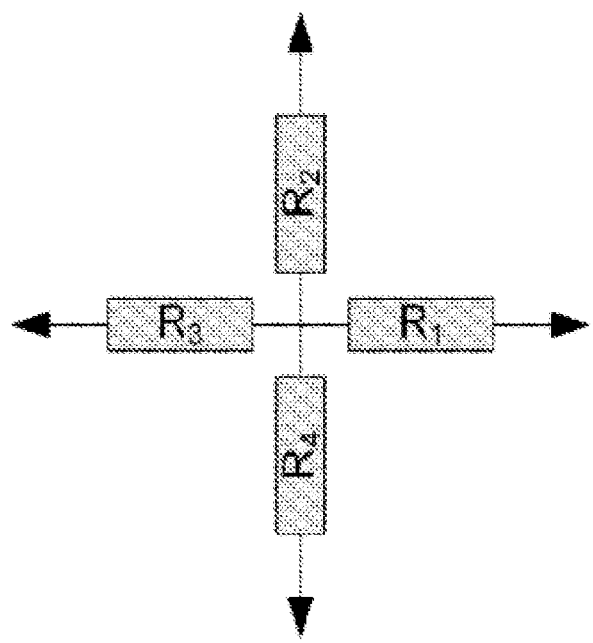
FIG. 4 is a structural schematic diagram of arrangement of four magnetic resistances in another embodiment of the present invention.

In order to determine the status of the free layer of the tunneling magnetic resistance chip in advance, the measurement range in 90 to 360 degrees is expanded, and another two orthogonally disposed chips $R_3$ and $R_4$ are added. The arrangement of the four chips is as shown in FIG. 4.

Figure 5:
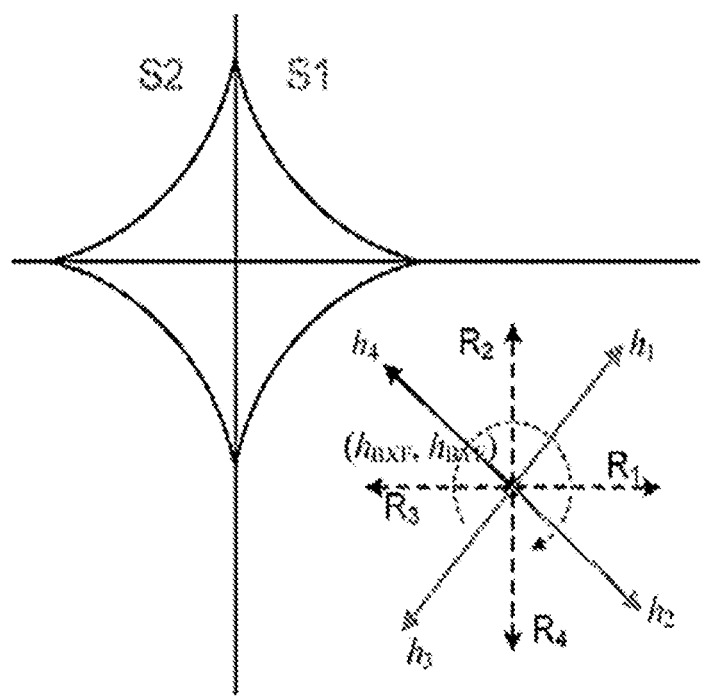
FIG. 5 is a simulated diagram of a measurement range varying with the intensity and angle of a measured magnetic field during measurement of the magnetic field with four magnetic resistances.

When the internal easy-axis bias magnetic fields of the free layers of the abovementioned four tunneling magnetic resistances are greater than the anisotropy field ($h_{BXF}>1$), the free layers of at least two tunneling magnetic resistances are in the S1 status and face the respective easy-axis positive directions, so that the two resistances can be used to carry out the iterative calculation to obtain a relatively large measurement range. Those skilled in the art can manufacture a tunneling magnetic resistance where the internal easy-axis bias magnetic field of the free layer is greater than the anisotropy field. Meanwhile, the two tunneling magnetic resistances, facing the hard-axis negative direction, of the measured magnetic field are smallest, so the two resistances in the S1 status can be determined through these two resistances. As shown in FIG. 5, relative to the easy-axis directions of $R_2$ and $R_3$, the measured magnetic field tends to its hard-axis negative direction, and the two resistance values are smallest. Relative to the easy-axis directions of $R_1$ and $R_2$, the measured magnetic field tends to its easy-axis positive direction and is located outside the asteroid-shaped curve, and its magnetic domain status certainly tends to the easy-axis positive direction and in the S1 status.

Therefore, the resistance values of the four resistances are measured at first to find out the two resistances with the smallest resistance values, and then it can be determined that the other two resistances are in the S1 status, and the two resistance values in the S1 status are substituted into the abovementioned step for interactive calculation, so as to obtain the intensity and direction of the magnetic field to be measured.

Figure 6:
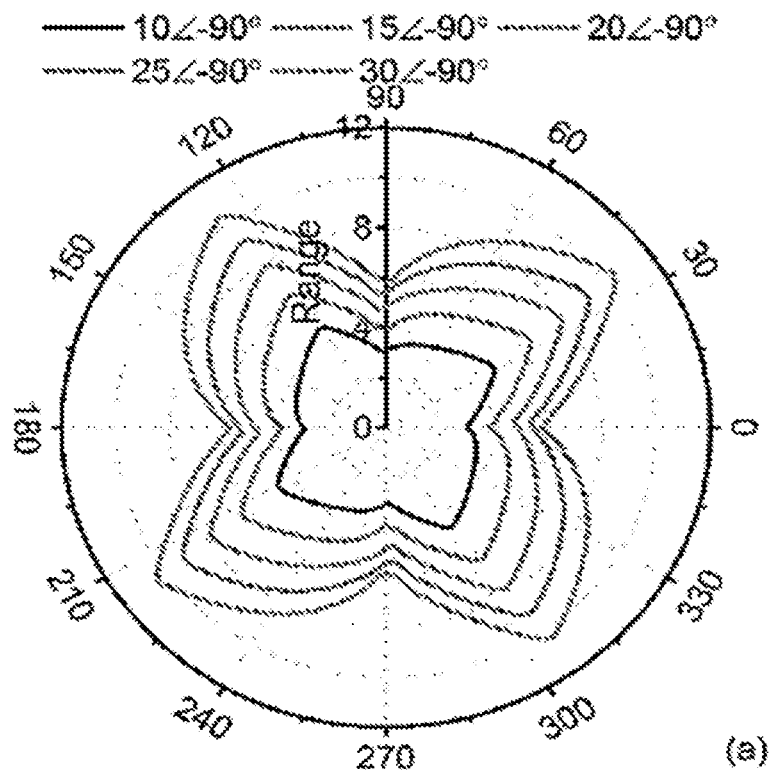
FIG. 6 shows a simulated diagram of a measurement range varying with the direction of a measured magnetic field during measurement of the magnetic field by adopting four magnetic resistances.

FIG. 6 shows a simulated diagram of a measurement range varying with the direction of a measured magnetic field during measurement of the magnetic field by adopting four magnetic resistances. Compared with FIG. 3, FIG. 6 adopts four magnetic resistances to measure an external magnetic field. When the direction of the external magnetic field is in 90 to 360 degrees, a relatively large measurement range can be also obtained.

FIG. 7 shows statuses of four magnetic resistances in different directions of the measured magnetic field when the four magnetic resistances are disposed as shown in FIG. 4. In actual application, the two magnetic resistances in the S1 status can be determined only according to the actually measured resistance values of the resistances without strictly referring to this sheet.

The present invention is not limited to the abovementioned specific implementation modes. The present invention is extended to any new features or any new combinations, and steps of any new methods or processes or any new combinations disclosed in this description.

The invention claimed is:
1. An all-quadrant measurement method for a middle-large magnetic field, comprising:
step 1: placing four orthogonally configured magnetic resistances in an external magnetic field, wherein the first magnetic resistance and the third magnetic resistance are located on one straight line, and the second magnetic resistance and the fourth magnetic resistance are located on the other straight line; the one straight line is perpendicular to the other straight line, and internal easy-axis bias magnetic fields of free layers of the four magnetic resistances are greater than an anisotropy field;
step 2: determining two magnetic resistances with the minimum resistance values, thereby determining that the other two magnetic resistances are in an S1 status, and making the resistance values of the two magnetic resistances which are in the S1 status be $R_1$ and $R_2$, and at the same time taking initial reference layer magnetization directions of the two magnetic resistances which are in the S1 status as given reference layer magnetization directions $\varphi_{R1}$ and $\varphi_{R2}$ in case of no magnetic field, wherein the S1 status means that a magnetic domain of a free layer of a magnetic resistance is in an easy-axis positive direction;

step 3: respectively calculating, according to the resistance values $R_1$ and $R_2$, included angles between free layer magnetization directions and the reference layer magnetization directions of the two magnetic resistances which are in the S1 status;

step 4: respectively calculating, according to the given reference layer magnetization directions $\varphi_{R1}$ and $\varphi_{R2}$ of the two magnetic resistances which are in the S1 status and the included angles between the free layer magnetization directions and the reference layer magnetization directions of the two magnetic resistances which are in the S1 status, the free layer magnetization directions of the two magnetic resistances which are in the S1 status;

step 5: solving, according to the given reference layer magnetization directions and the free layer magnetization directions of the two magnetic resistances which are in the S1 status, a magnetic field amplitude and direction of the external magnetic field; and step 6: comparing the magnetic field amplitude and direction, calculated at this time, of the external magnetic field with a previous calculation result, updating, according to the magnetic field amplitude and direction, calculated at this time, of the external magnetic field, the reference layer magnetization directions of the two magnetic resistances which are in the S1 status if a difference between the two results is greater than a set threshold value and taking the directions as new given reference layer magnetization directions $\varphi_{R1}$ and $\varphi_{R2}$, and carrying out steps 2 to 6 till the difference between the two results is smaller than the set threshold value.

2. The all-quadrant measurement method for a middle-large magnetic field according to claim 1, wherein in step 3, formulas for calculating the included angles between the free layer magnetization directions and the reference layer magnetization directions of the two magnetic resistances which are in the S1 status are respectively as below:

$$|\varphi_{F1} - \varphi_{R1}| = \arccos\left(\frac{R_{1max} + R_{1min} - 2R_1}{R_{1max} - R_{1min}}\right)$$

wherein $\varphi_{F1}$ is the free layer magnetization direction of the first magnetic resistance in the S1 status, $R_{1min}$ is the minimum value of the first magnetic resistance in the S1 status, and $R_{1max}$ is the maximum value of the first magnetic resistance in the S1 status;

$$|\varphi_{F2} - \varphi_{R2}| = \arccos\left(\frac{R_{2max} + R_{2min} - 2R_2}{R_{2max} - R_{2min}}\right)$$

wherein $\varphi_{F2}$ is the free layer magnetization direction of the second magnetic resistance in the S1 status, $R_{2min}$ is the minimum value of the second magnetic resistance in the S1 status, and $R_{2max}$ is the maximum value of the second magnetic resistance in the S1 status.

3. The all-quadrant measurement method for a middle-large magnetic field according to claim 1, wherein in step 4 of calculating the free layer magnetization directions of the two magnetic resistances which are in the S1 status according to the formula:

$\varphi_F = \varphi_R + |\varphi_F - \varphi_R|$, $\varphi_{F1} - \varphi_{R1}|$ and $\varphi_{R1}$ are substituted into the previous formula to obtain the free layer magnetization direction $\varphi_{F1}$ of the first magnetic resistance in the S1 status, and $|\varphi_{F2} - \varphi_{R2}|$ and $\varphi_{R2}$ are substituted into the previous formula to obtain the free layer magnetization direction $\varphi_{F2}$ of the second magnetic resistance in the S1 status, wherein $\varphi_F$ is the free layer magnetization direction of the magnetic resistance in the S1 status, $\varphi_R$ is the reference layer magnetization direction of the magnetic resistance in the S1 status, and $|\varphi_F - \varphi_{R1}|$ is the included angle between the free layer magnetization direction and the reference layer magnetization direction of the magnetic resistance in the S1 status.

4. The all-quadrant measurement method for a middle-large magnetic field according to claim 1, wherein step 5 comprises solving the magnetic field amplitude $h_F$ and direction $\theta$ of the external magnetic field by using the following equation set:

$$\begin{pmatrix} -\sin(\alpha_1 + \varphi_{F1}) & \cos(\alpha_1 + \varphi_{F1}) \\ -\sin(\alpha_2 + \varphi_{F2}) & \cos(\alpha_2 + \varphi_{F2}) \end{pmatrix} \begin{pmatrix} h_F\cos\theta \\ h_F\sin\theta \end{pmatrix} =$$

$$\begin{pmatrix} h_{BF}\sin(\varphi_{F1} - \theta_{BF}) + \sin\varphi_{F1}\cos\varphi_{F1} - h_{JFR}\sin(\varphi_{F1} - \varphi_{R1}) \\ h_{BF}\sin(\varphi_{F2} - \theta_{BF}) + \sin\varphi_{F2}\cos\varphi_{F2} - h_{JFR}\sin(\varphi_{F2} - \varphi_{R2}) \end{pmatrix}$$

wherein $\alpha_1$ and $\alpha_2$ are respectively easy-axis directions of the two magnetic resistances which are in the S1 status; $h_{JFR}$ is a coupling field of the free layer and the reference layer of any one of the magnetic resistances, $h_{BF} = H_{BF}/H_{AF}$; $H_{BF}$ refers to the size of an internal bias magnetic field of a free layer of a magnetic resistance; $H_{AF}$ refers to the size of an anisotropy field of a free layer; $\theta_{BF}$ is the direction of the internal bias magnetic field of the free layer; $\varphi_{F1}$ is the free layer magnetization direction of the first magnetic resistance in the S1 status; and $\varphi_{F2}$ is the free layer magnetization direction of the second magnetic resistance in the S1 status.

5. The all-quadrant measurement method for a middle-large magnetic field according to claim 1, wherein step 6 of updating the reference layer magnetization directions $\varphi_{R1}$ and $\varphi_{R2}$ of the two magnetic resistances which are in the S1 status further comprises:

solving a quartic equation $x_1^4 - 2h_{X1}x_1^3 + (h_{X1}^2 + h_{Y1}^2 - 1)x_1^2 + 2h_{X1}x_1 - h_{X1}^2 = 0$; wherein $h_{X1}$ and $h_{Y1}$ are respectively magnetic fields, in an easy-axis direction and a hard-axis direction of the first magnetic resistance in the S1 status, of the external magnetic field, and are obtained according to the calculation result of step 5: $h_{X1} = h_F \cos\theta$, $h_{Y1} = h_F \sin\theta$; $x_1 = \sin\varphi_{R1}$, wherein $h_F$ and $\theta$ are a magnetic field amplitude and direction of the external magnetic field, respectively;

the abovementioned quartic equation has four solutions; when the magnetic resistance is in a stable balanced state, $\varphi_{R1}$ only has one solution which is decided by three conditions that:

1) $x_1$ is a real number, and $|x_1| \leq 1$;
2) $h_{Y1} \cos\varphi_{R1} + h_{X1} \sin\varphi_{R1} + \cos 2\varphi_{R1} \geq 0$; and
3) the energy of all angles between the solution and an initial position of the magnetic resistance must be smaller than the energy of the initial position;

solving a quartic equation $x_2^4 - 2h_{X2}x_2^3 + (h_{X2}^2 + h_{Y2}^2 - 1)x_2^2 + 2h_{X2}x_2 - h_{X2}^2 = 0$, wherein $h_{X2}$ and $h_{Y2}$ are respectively magnetic fields, in an easy-axis direction and a hard-axis direction of the second magnetic resistance in the S1 status, of the external magnetic field, and are obtained according to the calculation result of step 5: $h_{X2} = h_F \sin\theta$, $h_{Y2} = h_F \cos\theta$; $x_2 = \sin\varphi_{R2}$;

the abovementioned quartic equation has four solutions; when the tunneling magnetic resistance is in a stable balanced state, $\varphi_{R2}$ only has one solution which is decided by three conditions that:
1) $x_2$ is a real number, and $|x_2| <= 1$;
2) $h_{Y2} \cos \varphi_{R2} + h_{X2} \sin \varphi_{R2} + \cos 2\varphi_{R2} >= 0$; and
3) the energy of all angles between the solution and an initial position of the magnetic resistance must be smaller than the energy of the initial position; and the solved $\varphi$ values are respectively taken as new given reference layer magnetization directions $\varphi_{R1}$ and $\varphi_{R2}$.

\* \* \* \* \*